United States Patent
Wu et al.

(10) Patent No.: US 10,007,367 B2
(45) Date of Patent: Jun. 26, 2018

(54) BEZEL STRUCTURE OF TOUCH SCREEN AND METHOD FOR MANUFACTURING THE SAME, TOUCH SCREEN AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Lingyan Wu, Beijing (CN); Lei Zhang, Beijing (CN); Taofeng Xie, Beijing (CN); Yang Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days. days.

(21) Appl. No.: 15/129,907

(22) PCT Filed: Jul. 10, 2015

(86) PCT No.: PCT/CN2015/083778
§ 371 (c)(1),
(2) Date: Sep. 28, 2016

(87) PCT Pub. No.: WO2016/101594
PCT Pub. Date: Jun. 30, 2016

(65) Prior Publication Data
US 2017/0177105 A1 Jun. 22, 2017

(30) Foreign Application Priority Data
Dec. 26, 2014 (CN) .......................... 2014 1 0834836

(51) Int. Cl.
*G06F 3/041* (2006.01)
*H05K 1/11* (2006.01)
(Continued)

(52) U.S. Cl.
CPC .............. *G06F 3/041* (2013.01); *H05K 1/111* (2013.01); *H05K 3/10* (2013.01); *H05K 3/32* (2013.01);
(Continued)

(58) Field of Classification Search
CPC ...... G06F 3/041; G06F 3/0412; G06F 3/0414; G06F 3/0416; G06F 3/044; G06F 3/045; G06F 3/047
(Continued)

(56) References Cited

U.S. PATENT DOCUMENTS 8,484,838 B2 7/2013 Badaye et al.
9,395,851 B2 7/2016 Mikladal et al.
(Continued)

FOREIGN PATENT DOCUMENTS

CN 102290404 A 12/2011
CN 102662548 A 9/2012
(Continued)

OTHER PUBLICATIONS

International Search Report and Written Opinion, including the English translation of Box No. V of the Written Opinion, for International Application No. PCT/CN2015/083778, dated Sep. 25, 2015, 13 pages.
(Continued)

*Primary Examiner* — Amare Mengistu
*Assistant Examiner* — Nelson Lam
(74) *Attorney, Agent, or Firm* — Westman, Champlin & Koehler, P.A.

(57) ABSTRACT

A bezel structure of a touch screen is disclosed by the invention. A touch screen having the bezel structure, a
(Continued)

display device having the touch screen, and a method for manufacturing the bezel structure of the touch screen are also disclosed by the invention.

20 Claims, 6 Drawing Sheets (51) Int. Cl.
*H05K 3/10* (2006.01)
*H05K 3/32* (2006.01)
*H05K 1/02* (2006.01)
*H05K 1/09* (2006.01)

(52) U.S. Cl.
CPC .. *G06F 2203/04103* (2013.01); *H05K 1/0274* (2013.01); *H05K 1/09* (2013.01); *H05K 2201/0108* (2013.01); *H05K 2201/03* (2013.01); *H05K 2201/10128* (2013.01)

(58) Field of Classification Search
USPC .................................................. 345/173–179
See application file for complete search history.

(56) References Cited

U.S. PATENT DOCUMENTS

| | | | |
|---|---|---|---|
| 2010/0085315 A1 | 4/2010 | Hsih | |
| 2011/0007005 A1* | 1/2011 | Lee | G06F 3/047 345/173 |
| 2011/0134056 A1* | 6/2011 | Kim | G06F 3/0412 345/173 |
| 2011/0141034 A1* | 6/2011 | Lai | G06F 3/041 345/173 |
| 2011/0254804 A1* | 10/2011 | Kuo | G06F 3/0418 345/174 |
| 2011/0309468 A1 | 12/2011 | Oh et al. | |
| 2012/0212426 A1* | 8/2012 | Lin | G06F 3/044 345/173 |
| 2012/0227259 A1 | 9/2012 | Badaye et al. | |
| 2012/0256642 A1 | 10/2012 | Badaye et al. | |
| 2013/0249863 A1* | 9/2013 | Misaki | G06F 3/044 345/174 |
| 2014/0062909 A1* | 3/2014 | Choi | G09G 3/32 345/173 |
| 2015/0169109 A1* | 6/2015 | Park | G06F 3/044 345/174 |
| 2015/0199055 A1 | 7/2015 | Prendergast et al. | |
| 2016/0034081 A1 | 2/2016 | Ichiki | |
| 2016/0098113 A1 | 4/2016 | Ding et al. | |
| 2016/0202780 A1* | 7/2016 | Chien | G06F 3/041 345/173 |
| 2017/0177105 A1* | 6/2017 | Wu | G06F 3/041 |

FOREIGN PATENT DOCUMENTS

| | | |
|---|---|---|
| CN | 102884495 A | 1/2013 |
| CN | 102985900 A | 3/2013 |
| CN | 102999217 A | 3/2013 |
| CN | 203070250 U | 7/2013 |
| CN | 203480484 U | 3/2014 |
| CN | 203588244 U | 5/2014 |
| CN | 103970334 A | 8/2014 |
| CN | 103970392 A | 8/2014 |
| CN | 203858616 U | 10/2014 |
| CN | 203894715 U | 10/2014 |
| CN | 203930738 U | 11/2014 |
| CN | 203930765 U | 11/2014 |
| CN | 104503617 A | 4/2015 |
| CN | 204390203 U | 6/2015 |
| WO | 2014/171426 A1 | 10/2014 |

OTHER PUBLICATIONS

First Office Action, including Search Report, for Chinese Patent Application No. 201410834836.1, dated Jan. 24, 2017, 17 pages.
Second Office Action from Chinese Patent Application No. 201410834836.1, dated Jul. 3, 2017, 14 pages.

* cited by examiner

Fig.6

BEZEL STRUCTURE OF TOUCH SCREEN AND METHOD FOR MANUFACTURING THE SAME, TOUCH SCREEN AND DISPLAY DEVICE

CROSS-REFERENCE TO RELATED APPLICATION

This application is a 371 National Stage application of PCT/CN2015/083778, filed 10 Jul. 2015, which published as WO 2016/101594 A1 on 30 Jun. 2016, and claims priority to Chinese Patent Application No. 201410834836.1 filed on Dec. 26, 2014 in the State Intellectual Property Office of China, the whole disclosure of which is incorporated herein by their reference.

BACKGROUND OF THE INVENTION

Field of the Invention

Embodiments of the present invention relate to the technical field of display technology, and in particular to a bezel structure of a touch screen, a touch screen having the bezel structure, a display device having the touch screen, and a method for manufacturing the bezel structure of the touch screen.

Description of the Related Art

With the development of the touch screen industry, on the basis of market demand, a bezel portion of a touch screen tends to become a slim bezel.

Nowadays, metal wires are typically utilized as edge-routing wires in a surrounding bezel. Metal wires possess property of superior conductivity, narrow line width and low electrical resistance, fulfilling requirements for a slim bezel. However, due to non-transparent property of metallic material, and in consideration of appearance requirements, a bezel-free touch screen may not be realized in case that metal wires function as edge-routing wires. Slim-bezel touch screen products which may be producible with metal wires mainly comprises mobile-phone touch screens of 2-3 mm width, TPC/NB touch screens with a width on the order of 5 mm, and MNT touch screen with a width on the order of 10 mm.

Currently, in all commercially available OGS (One Glass Solution) products, metal wires are adopted as edge-routing wires. However, such products as mentioned above still fail to be implemented to be bezel-free; and as to a portion of small-sized products, a slimmest bezel may only be manufactured with a width on the order of 2 mm.

There is demand for bezel-free touch screens in the prior art.

SUMMARY OF THE INVENTION

Embodiments of the present invention have been made to overcome or alleviate at least one aspect of the above mentioned disadvantages and/or shortcomings, i.e., to realize a bezel-free touch screen, by providing a bezel structure of a touch screen and a method for manufacturing the same, a touch screen and a display device.

Following technical solutions are adopted in exemplary embodiments of the invention for achieving the above desired technical purposes.

According to an aspect of the embodiments of the present invention, it is provided a bezel structure of a touch screen, the touch screen is provided with a substrate, the bezel structure comprising: a black matrix portion provided on an end side at an end on a back surface of the substrate; a bonding area arranged on the black matrix portion and provided with a plurality of metal leads and a plurality of transparent conductive solder pads, each of the plurality of transparent conductive solder pads being electrically connected with corresponding one metal lead of the plurality of metal leads; a first insulating photoresist layer arranged between the plurality of transparent conductive solder pads and the plurality of metal leads in a thickness direction of the substrate, the transparent conductive solder pads being electrically connected with corresponding metal leads via jumper holes provided in the first insulating photoresist layer; and a plurality of transparent conductive edge-routing wires arranged on the back surface of the substrate, at both lateral sides thereof adjacent to the end side, each of the plurality of transparent conductive edge-routing wires extending to the bonding area and being constructed at a terminal end thereof as corresponding one of the plurality of transparent conductive solder pads located within the bonding area.

Optionally, the black matrix portion, the transparent conductive solder pads, the first insulating photoresist layer and the metal leads are arranged sequentially in a thickness direction of the substrate therefrom.

Further optionally, the bezel structure further comprises a second insulating photoresist layer, the second insulating photoresist layer being arranged on a side of the metal leads away from the first insulating photoresist layer.

Optionally, the black matrix portion, the metal leads, the first insulating photoresist layer and the transparent conductive solder pads are arranged sequentially in a thickness direction of the substrate therefrom.

Further optionally, the bezel structure further comprises a second insulating photoresist layer, the second insulating photoresist layer being arranged on a side of the transparent conductive solder pads away from the first insulating photoresist layer.

Optionally, the bezel structure further comprises a plurality of X-direction transparent conducting bars and a plurality of Y-direction transparent conducting bars substantially parallel to the transparent conductive edge-routing wires, both of which are arranged in a central area on the back surface of the substrate, the X-direction transparent conducting bars and the Y-direction transparent conducting bars being electrically isolated from each other.

Optionally, the plurality of X-direction transparent conducting bar are electrically connected with one another via corresponding transparent conductive bridges formed on the substrate, and the transparent conductive bridges are provided with an auxiliary insulating photoresist layers above which the Y-direction transparent conducting bars are arranged.

Optionally, the first insulating photoresist layer and the auxiliary insulating photoresist layer are arranged in a same layer and are formed by a same material.

Optionally, the bezel structure is in a form of an OGS bezel structure.

According to another aspect of the embodiments of the present invention, it is provided a touch screen, comprising the aforementioned bezel structure.

According to still another aspect of the embodiments of the present invention, it is provided a display device, comprising the aforementioned touch screen.

According to yet another aspect of the embodiments of the present invention, it is provided a method for manufacturing a bezel structure of a touch screen, the touch screen being provided with a substrate, and the method comprising steps of: step S100, forming a black matrix portion on an end side at an end on a back surface of the substrate, the black matrix portion being adapted to be formed with a bonding area thereon; step S200, forming a plurality of transparent conductive edge-routing wires arranged on the back surface of the substrate, at both lateral sides thereof adjacent to the end side, each of the plurality of transparent conductive edge-routing wires extending to the bonding area and being constructed at a terminal end thereof as corresponding one of the plurality of transparent conductive solder pads located within the bonding area; step S300, forming a first insulating photoresist layer on the back surface of the substrate, the first insulating photoresist layer being formed with jumper hole and each of the jumper holes being positioned at a site where each of the transparent conductive solder pads is located; and step S400, disposing a plurality of metal leads on the bonding area; and each of the transparent conductive solder pads is electrically connected with corresponding metal leads via a jumper hole.

Optionally, within above method, the steps of S100-S400 are performed sequentially.

Furthermore, the step S200 further comprises forming a plurality of transparent conductive bridges within a central area on the back surface of the substrate by a same material as that used to form the transparent conductive edge-routing wires; and the step S300 further comprises forming an auxiliary insulating photoresist layer which covers partially each of the plurality of transparent conductive bridges, by a same material as that used to form the first insulating photoresist layer.

Further optionally, above method further comprises an additional step after the step S300 and before the step S400, the additional step comprising: forming a plurality of X-direction transparent conducting bars and a plurality of Y-direction transparent conducting bars within a central area on the back surface of the substrate, wherein, the plurality of X-direction transparent conducting bars being electrically connected with one another via corresponding transparent conductive bridges located at the joints thereamong, the plurality of Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer.

Optionally, above method further comprises: after the step S400, a second insulating photoresist layer is formed to cover the back surface of the substrate.

Otherwise optionally, the steps S100, S400, S300, and S200 are performed sequentially.

Furthermore, the step S400 further comprises forming a plurality of transparent conductive bridges within a central area on the back surface of the substrate by a same material as that used to form the metal leads; and the step S300 further comprises forming an auxiliary insulating photoresist layer which covers partially each of the plurality of transparent conductive bridges, by a same material as that used to form the first insulating photoresist layer.

Further optionally, the step S200 further comprises: forming a plurality of X-direction transparent conducting bars and a plurality of Y-direction transparent conducting bars within a central area on the back surface of the substrate, wherein, the plurality of X-direction transparent conducting bars being electrically connected with one another via corresponding transparent conductive bridges located at the joints thereamong, the plurality of Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer.

Optionally, the method further comprises: after the step S200, a second insulating photoresist layer is formed to cover the back surface of the substrate.

In the exemplary embodiments of the present invention, transparent conductive material is formed as edge-routing wires so as to realize a bezel-free technology, providing an improved user experience.

BRIEF DESCRIPTION OF THE DRAWINGS

The above and other features and advantages of the present invention will become more apparent and a more comprehensive understanding of the present invention can be obtained, by describing in detail exemplary embodiments thereof with reference to the accompanying drawings.

FIGS. 1-6 shows structural schematic views embodying a method for manufacturing a bezel structure of a touch screen according to an exemplary embodiment of the present invention; and in each figure, an illustrative top view is illustrated at left-hand side while an illustrative end view or cross-section view is illustrated at right-hand side, in which:

DETAILED DESCRIPTION OF PREFERRED EMBODIMENTS OF THE INVENTION

A bezel structure of a touch screen, a touch screen having the bezel structure, a display device having the touch screen, and a method for manufacturing a bezel structure of a touch screen provided by exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the invention in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component are only intended to exemplarily illustrate the contents of the disclosure, rather than to demonstrate/reflect the practical dimension or proportion of the touch screen or the bezel structure. Even in the end view at the right hand side and the top view at the left hand side there may be some non-correspondence therebetween.

Exemplary embodiments of the present invention relate to a method for manufacturing a bezel structure of a touch screen, the touch screen being provided with a substrate, and the method comprising steps of:

step S100, forming a black matrix portion on an end side at an end on a back surface of the substrate, the black matrix portion being adapted to be formed with a bonding area thereon;

step S200, forming a plurality of transparent conductive edge-routing wires arranged on the back surface of the substrate, at both lateral sides thereof adjacent to the end side, each of the plurality of transparent conductive edge-routing wires extending to the bonding area and being constructed at a terminal end thereof as corresponding one of the plurality of transparent conductive solder pads located within the bonding area;

step S300, forming a first insulating photoresist layer on the back surface of the substrate, the first insulating photoresist layer being formed with jumper hole and each of the jumper holes being positioned at site where each of the transparent conductive solder pads may be located within the bonding area; and step S400, disposing a plurality of metal leads on the bonding area;

wherein each of the transparent conductive solder pads are electrically connected with corresponding metal leads via jumper holes.

On the basis of above method, transparent conductive material is formed as edge-routing wires such that a bezel-free technology may be realized, providing an improved user experience to users.

In the exemplary embodiments of the present invention, by way of example, above bezel structure is an OGS bezel structure, so as to decrease the thickness of the touch screen.

In the exemplary embodiments of the present invention, a material for forming the transparent conductive edge-routing wires, transparent conductive solder pads and subsequent transparent conductive bridges may be for example a suitable transparent conductive material such as ITO, FTO, AZO, and so on.

In an exemplary embodiment of the present application, the steps of S100-S400 are performed sequentially. Above steps may be set forth in details according to FIGS. 1-6, as below.

Figure 1:
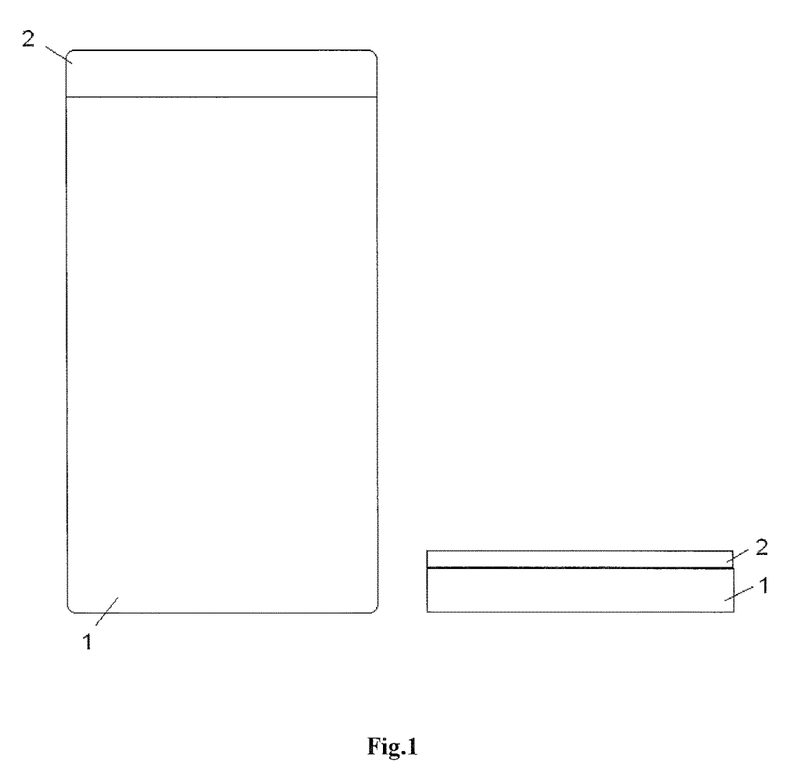
FIG. 1 illustrates a schematic view of forming a black matrix portion on a substrate, where a planar schematic view is illustrated at the left hand side while a side view is illustrated at the right hand side.

As illustrated in FIG. 1, in step S100, a BM (black matrix) portion 2 is formed on a short edge (i.e., an upper end of the planar schematic view illustrated in FIG. 1) at an end on a back surface of the substrate 1, the BM portion 2 being adapted to be formed with a bonding area thereon. In the exemplary embodiments of the present invention, the back surface of the substrate 1 refers to a side thereof opposed to a side facing towards the user. The BM portion is only provided within an area which forms the bonding area rather than on other three sides. By way of example, the BM portion is formed, e.g., by a first mask process.

Figure 2:
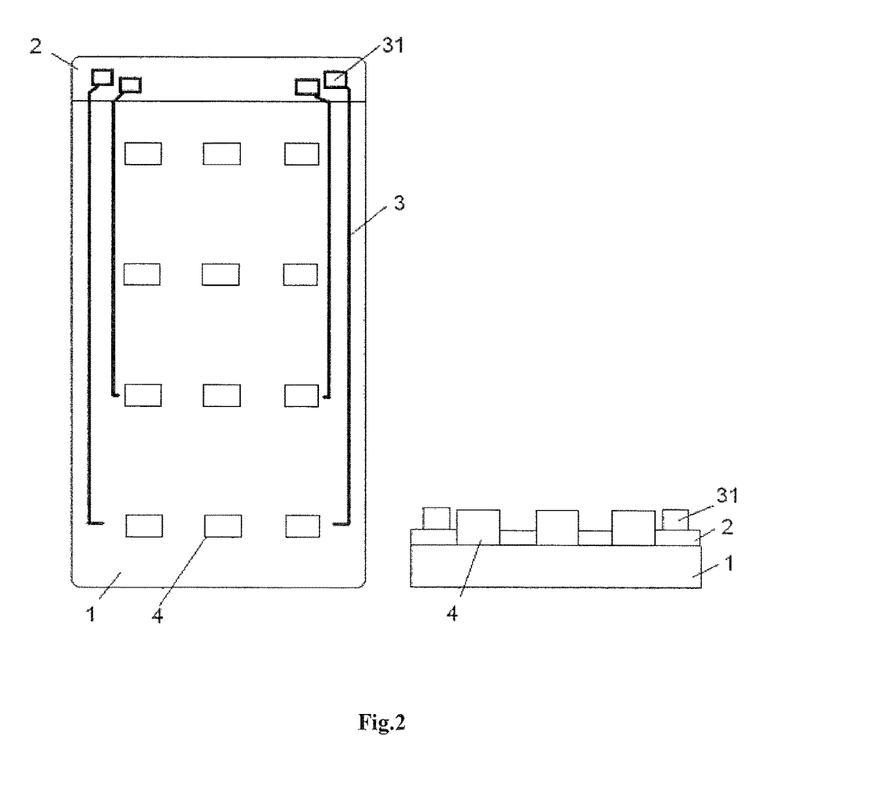
FIG. 2 illustrates a schematic view of forming a first transparent conductive layer, where a planar schematic view is illustrated at the left hand side while a side view is illustrated at the right hand side.

As illustrated in FIG. 2, in step S200, a plurality of transparent conductive edge-routing wires 3 are formed on the back surface of the substrate 1, along two long edges at both lateral sides thereof, each of the plurality of transparent conductive edge-routing wires 3 extending to the bonding area and being constructed at a terminal end thereof as a corresponding transparent conductive solder pad 31 located within the bonding area. As illustrated in FIG. 2, the step S200 further comprises forming a plurality of transparent conductive bridges 4 within a central area on the back surface of the substrate 1 by a same material as that used to form the transparent conductive edge-routing wires 3. As such, the transparent conductive edge-routing wires 3, the transparent conductive solder pads 31 and the transparent conductive bridges 4 are formed, e.g., by a single second mask process, such that the manufacturing process is simplified and the manufacturing cost is decreased.

Figure 3:
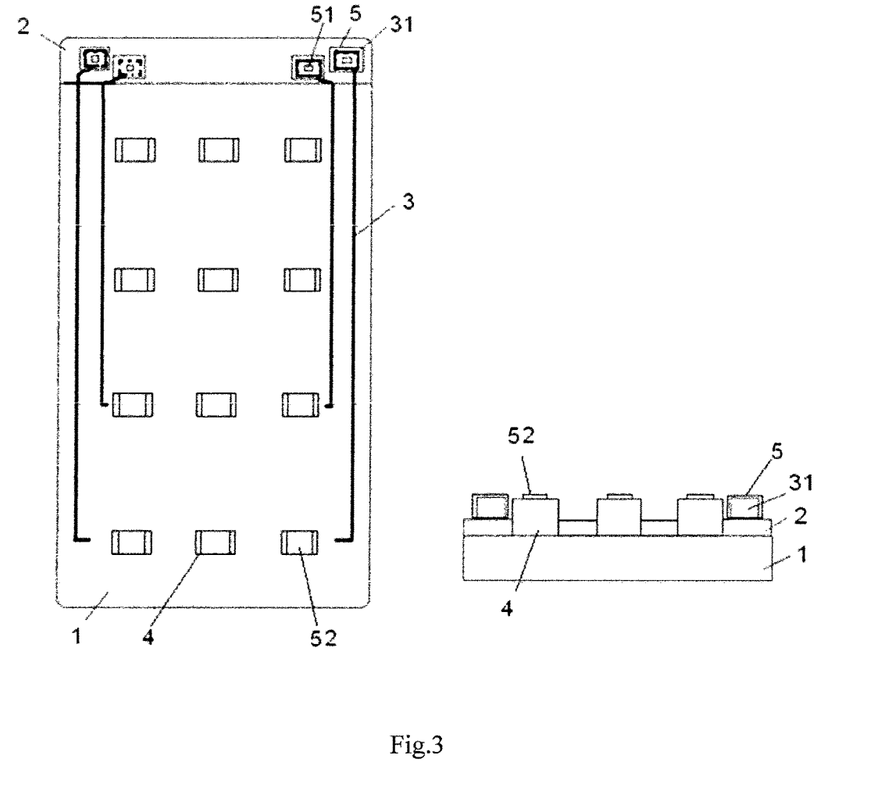
FIG. 3 illustrates a schematic view of forming a first insulating photoresist layer, where a planar schematic view is illustrated at the left hand side while a side view is illustrated at the right hand side.

As illustrated in FIG. 3, in step S300, a first insulating photoresist layer 5 is formed on the back surface of the substrate 1, the first insulating photoresist layer 5 being formed with jumper hole 51 and each of the jumper holes being positioned at site where each of the transparent conductive solder pads 31 is located. In the exemplary embodiments of the present invention, the insulating photoresist layer functions to have insulative and protective effects. As illustrated in FIG. 3, the step S300 further comprises forming an auxiliary insulating photoresist layer 52 which covers partially each of the plurality of transparent conductive bridges 4, by a same material as that used to form the first insulating photoresist layer 5. As such, the first insulating photoresist layer 5 and the auxiliary insulating photoresist layer 52 are formed, e.g., by a single third mask process, such that the manufacturing process is simplified and the manufacturing cost is decreased.

Figure 4:
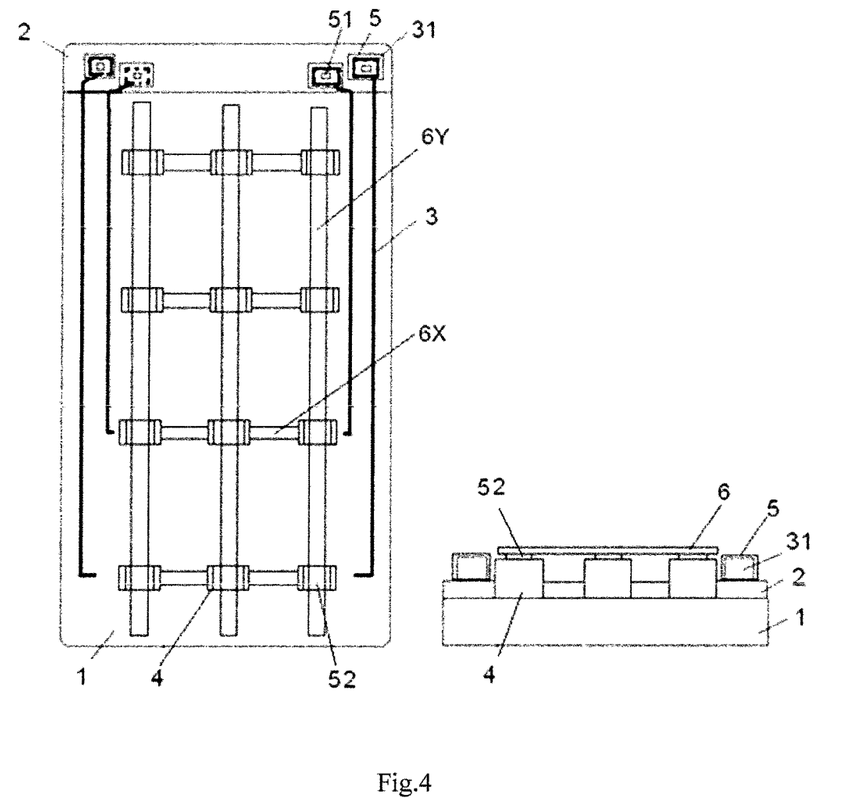
FIG. 4 illustrates a schematic view of forming a second transparent conductive layer, where a planar schematic view is illustrated at the left hand side while a side view is illustrated at the right hand side.

As illustrated in FIG. 4, after the step S300, the method further comprises: forming a plurality of X-direction (i.e., in a transverse direction) transparent conducting bars 6X and a plurality of Y-direction (i.e., in a longitudinal direction) transparent conducting bars 6Y (both the transparent conducting bars 6X and 6Y are collectively labeled by reference numeral 6 in the schematic view at the right hand side of FIG. 4) within a central area on the back surface of the substrate 1, wherein, the plurality of X-direction transparent conducting bars 6X being electrically connected to one another via corresponding transparent conductive bridges 4 located at the joints thereamong, the plurality of Y-direction transparent conducting bars 6Y being arranged above the corresponding auxiliary insulating photoresist layer 52, and the X-direction transparent conducting bars 6X and the Y-direction transparent conducting bars 6Y being electrically isolated from each other, e.g., via the auxiliary insulating photoresist layer 52. As such, the X-direction transparent conducting bars 6X and the Y-direction transparent conducting bars 6Y are formed, e.g., by a single fourth mask process, such that the manufacturing process is simplified and the manufacturing cost is decreased.

The expression "the first insulating photoresist layer 5 covers partially" hereinbefore refers to: in a case that the conductive bridges 4 are electrically isolated from the Y-direction transparent conducting bars 6Y via the auxiliary insulating photoresist layer 52, a portion of the conductive bridges may be exposed so as to connect the conductive bridges 4 with the X-direction transparent conductive bars electrically. In other words, in a same row, the X-direction transparent conducting bars 6X comprise a plurality of sub-divided transparent conducting bars which are interconnected electrically via the conductive bridges 4.

Figure 5:
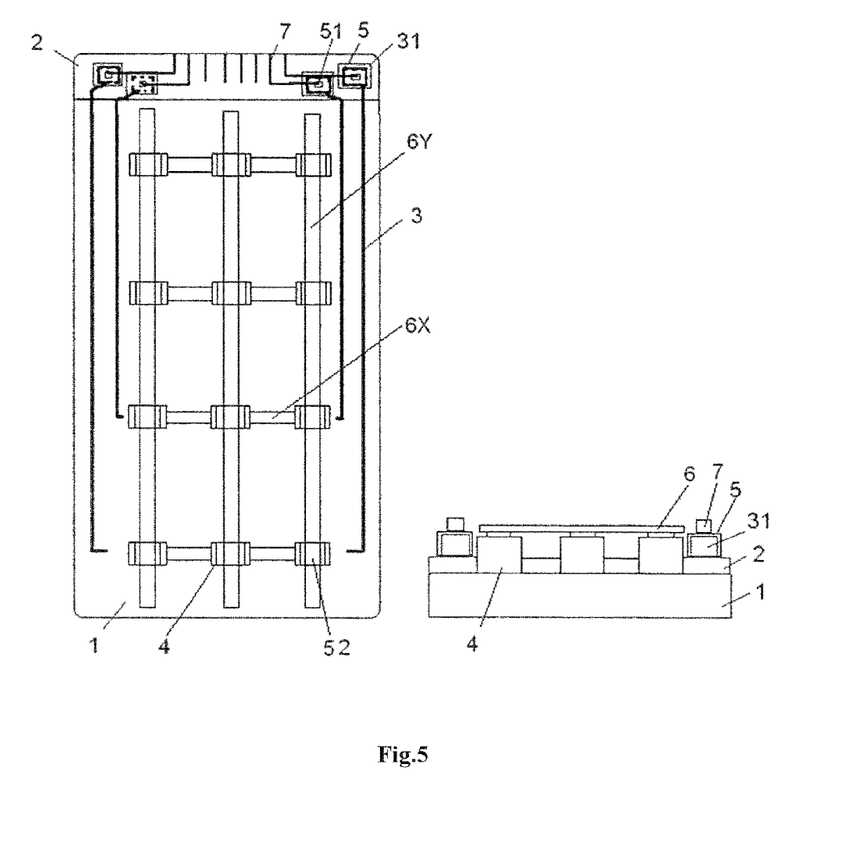
FIG. 5 illustrates a schematic view of forming a metal layer or a metal lead layer, where a planar schematic view is illustrated at the left hand side while a side view is illustrated at the right hand side.

As illustrated in FIG. 5, in step S400, a plurality of metal leads 7 are disposed on the bonding area; and each of the transparent conductive solder pads 31 are for example electrically connected with corresponding metal leads 7 via jumper holes 51. Meanwhile, by way of example, a pattern of the metal leads 7 may be formed by a single fifth mask process.

Figure 6:
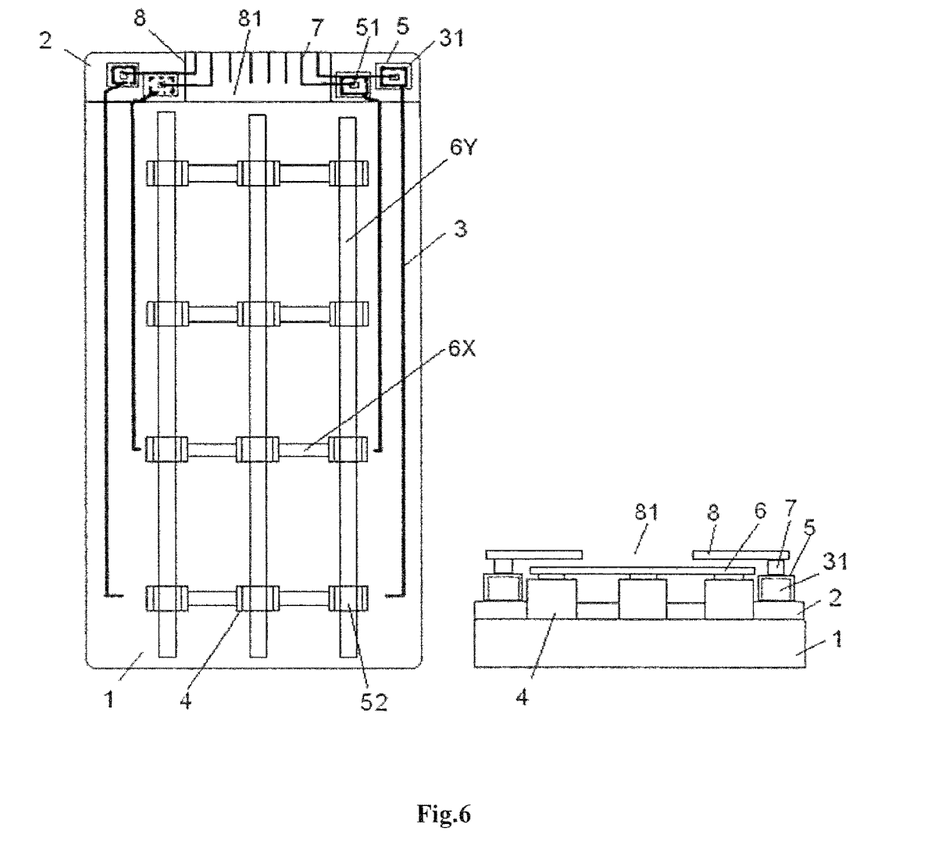
FIG. 6 illustrates a schematic view of forming a second insulating photoresist layer, where a planar schematic view is illustrated at the left hand side while a side view is illustrated at the right hand side.

As illustrated in FIG. 6, after the step S400, for example, a second insulating photoresist layer 8 is also formed to cover the back surface of the substrate 1, so as to enhance shading property on the back surface of the substrate 1. By way of example, a second insulating photoresist layer 8 may be formed by a single sixth mask process.

Apparently, it is necessary that, corresponding portions in the bonding area should be vacated from the second insulating photoresist layer 8. As illustrated in FIG. 6, the second insulating photoresist layer 8 is provided with an opening portion 81 for exposing the metal leads 7 of the bonding area, such that FPC (Flexible Printed Circuit) may be connected electrically with the metal leads 7 of the bonding area via an ACF (Anisotropic Conductive Film).

FIGS. 1-6 illustrate a method for manufacturing a bezel structure of a touch screen by six mask processes.

Optionally, in order to save manufacturing cost, by way of example, the bezel structure of the touch screen may be also manufacture by four mask processes. Specifically, firstly, a BM portion is formed by a single first mask process; then, by a single second mask process, conductive bridges are formed within a central area on the back surface of the substrate and metal leads are formed in the bonding area of the substrate; afterwards, by a single third mask process, both a first insulating photoresist layer and an auxiliary insulating photoresist layer are formed, the first insulating photoresist layer being provided with jumper holes thereon; after the first insulating photoresist layer is formed, e.g., by a single fourth mask process, a plurality of transparent conductive edge-routing wires are formed on the back surface of the substrate, at both lateral sides thereof, each of the plurality of transparent conductive edge-routing wires extending to the bonding area to form transparent conductive solder pads each of which is electrically connected with corresponding metal lead via corresponding jumper hole; meanwhile, forming X-direction transparent conducting bars and Y-direction transparent conducting bars within a central area on the back surface of the substrate, wherein, the X-direction transparent conducting bars being electrically connected to one another via corresponding transparent conductive bridges, the Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer 52.

Optionally, in order to save manufacturing cost, by way of example, the bezel structure of the touch screen may be manufacture by five mask processes. Specifically, firstly, a BM portion is formed by a single first mask process; then, by a single second mask process, conductive bridges are formed within a central area on the back surface of the substrate and metal leads are formed in the bonding area of the substrate; afterwards, by a single third mask process, both a first insulating photoresist layer and an auxiliary insulating photoresist layer are formed, the first insulating photoresist layer being provided with jumper holes thereon; after the first insulating photoresist layer is formed, e.g., by a single fourth mask process, a plurality of transparent conductive edge-routing wires are formed on the back surface of the substrate, at both lateral sides thereof, each of the plurality of transparent conductive edge-routing wires extending to the bonding area to form transparent conductive solder pads each of which is electrically connected with corresponding metal lead via corresponding jumper hole; meanwhile, forming X-direction transparent conducting bars and Y-direction transparent conducting bars within a central area on the back surface of the substrate, wherein, the X-direction transparent conducting bars being electrically connected with one another via corresponding transparent conductive bridges, the Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer 52. Finally, a second insulating photoresist layer is formed to cover the back surface of the substrate by a single fifth mask process.

In both the four-mask process and the five-mask process, when the transparent conductive layer (comprising transparent conductive edge-routing wires, transparent conductive solder pads, transparent conductive bridges, X-direction transparent conducting bars and Y-direction transparent conducting bars) is formed, an etching solution is required which is typically an acidic solution and tends to have adverse effect on the metal leads. However, after formation of the transparent conductive layer, since the first insulating photoresist layer and the auxiliary insulating photoresist layer are adopted to cover the transparent conductive layer, then, upon etching the first insulating photoresist layer, a developing solution is typically an alkaline solution and thus may not have adverse effect on the metal leads and metal bridging points.

In the above exemplary embodiments, it is depicted that the steps S100 to S400 may be performed sequentially. In an alternative embodiment, the steps S100, S400, S300, and S200 are performed sequentially. In other words, the step S200 of forming the transparent conductive solder pads and the step S400 of forming the metal leads are exchangeable, and the step S300 of forming the first insulating photoresist layer should be carried out between the step S200 and the step S400, so as to implement the electrical isolation between the transparent conductive solder pads and the formed metal leads.

It should be pointed out that, the aforementioned exemplary embodiments are only illustrative. By way of example, in the method for manufacturing the bezel structure of the touch screen, upon forming the transparent conductive edge-routing wires, e.g., it is possible that the transparent conductive bridges, the X-direction transparent conducting bars and the Y-direction transparent conducting bars are not formed simultaneously; upon forming the metal leads, it is also possible that metal bridging points are not formed simultaneously.

On the basis of above exemplary embodiments, as illustrated in FIGS. 5-6, a bezel structure of a touch screen may be provided by exemplary embodiments of a further aspect of the invention, the touch screen having a substrate 1 and the bezel structure comprising: a BM portion 2 provided at an end on a back surface of the substrate 1; a bonding area arranged on the BM portion and provided with a plurality of metal leads 7 and a plurality of transparent conductive solder pads 31, each of the plurality of transparent conductive solder pads 31 being electrically connected with corresponding one of the plurality of metal leads 7; a first insulating photoresist layer 5 arranged between the plurality of transparent conductive solder pads 31 and the plurality of metal leads 7 in a thickness direction of the substrate 1, the transparent conductive solder pads 31 being electrically connected with corresponding metal leads 7 via jumper holes 51 provided in the first insulating photoresist layer 5; and a plurality of transparent conductive edge-routing wires 3 arranged on the back surface of the substrate 1, at both lateral sides thereof, each of the plurality of transparent conductive edge-routing wires 3 extending to the bonding area and being constructed as corresponding one of the plurality of transparent conductive solder pads 31.

In above bezel structure, transparent conductive material is used as edge-routing wires such that a bezel-free technology may be realized, providing an improved user experience to users.

Optionally, within the bonding area on the back surface of the substrate 1, the BM portion 2, the transparent conductive solder pads 31, the first insulating photoresist layer 5, and the metal leads 7 are arranged sequentially in a thickness direction of the substrate 1.

Further optionally, the bezel structure further comprises a second insulating photoresist layer 8, wherein, within the bonding area on the back surface of the substrate 1, the BM portion 2, the transparent conductive solder pads 31, the first insulating photoresist layer 5, the metal wires 5, and the second insulating photoresist layer 8 are arranged sequentially in a thickness direction of the substrate 1. As such, the second insulating photoresist layer is arranged on a side of the metal leads away from the first insulating photoresist layer.

In an alternative exemplary embodiment of the present invention, within the bonding area on the back surface of the substrate 1, the BM portion, the metal leads, the first insulating photoresist layer, and the transparent conductive solder pads are arranged sequentially in a thickness direction of the substrate.

Furthermore, the bezel structure further comprises a second insulating photoresist layer, wherein within the bonding area on the back surface of the substrate, the BM portion, the metal leads, the first insulating photoresist layer, the transparent conductive solder pads and the second insulating photoresist layer are arranged sequentially in a thickness direction of the substrate. As such, the second insulating photoresist layer is arranged on a side of the transparent conductive solder pads away from the first insulating photoresist layer. In other words, in the exemplary embodiments of the present invention, the positions of the metal leads and the transparent conductive solder pads are exchangeable; however, there is a first insulating photoresist layer provided therebetween.

The bezel structure according to an exemplary embodiment of the invention further comprises a plurality of X-direction transparent conducting bars 6X extending in a transverse direction and a plurality of Y-direction transparent conducting bars 6Y substantially parallel to the transparent conductive edge-routing wires, both of which are arranged in a central area (i.e., areas outside the bonding area) on the back surface of the substrate 1, wherein, the X-direction transparent conducting bars 6X and the Y-direction transparent conducting bars 6Y being electrically isolated from each other. The X-direction transparent conducting bars 6X and the Y-direction transparent conducting bars 6Y are electrically connected with respective transparent conductive edge-routing wires 3, so as to control the X-direction transparent conducting bars 6X and the Y-direction transparent conducting bars 6Y by a control circuit via FPC, and in turn to implement display function.

In an exemplary embodiment, the X-direction transparent conducting bar 6X are electrically connected with one another via corresponding transparent conductive bridges 4 formed on the substrate 1, on which transparent conductive bridges 4 there is provided an auxiliary insulating photoresist layer 52 above which the Y-direction transparent conducting bars 6Y are arranged, so as to achieve mutual electrical isolation between the X-direction transparent conducting bars 6X and the Y-direction transparent conducting bars 6Y. Furthermore, the first insulating photoresist layer 5 and the auxiliary insulating photoresist layer 52 are arranged in a same layer and are formed by a same material, so as to achieve the object by a single mask process, such that the manufacturing process is simplified and the manufacturing cost is decreased.

Correspondingly, a touch screen is provided by the invention, comprising the aforementioned bezel structure.

Correspondingly, a display device is provided, comprising the aforementioned touch screen. By way of example, the display device may be products or components with display functionality, such as Liquid Crystal Panel, Electronic Paper, OLED Panel, Mobile Phone, Tablet PC, Television Set, Monitor, Laptop, Digital Photo Frame, Navigator, and so on. On the basis of a shadow elimination process, the technical solution of the present invention is especially applicable for small-sized touch screen, e.g., a touch screen with a dimension less than 10 inch.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present invention exemplarily, and should not be deemed as a restriction thereof.

Although several exemplary embodiments of the general concept of the present invention have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

LIST OF REFERENCE NUMERALS 1 substrate
2 BM (black matrix) portion
3 transparent conductive edge-routing wires
31 transparent conductive solder pads
4 transparent conductive bridges 5 first insulating photoresist layer
51 jumper holes
52 auxiliary insulating photoresist layer
6X X-direction transparent conducting bars
6Y Y-direction transparent conducting bars
7 metal wires
8 second insulating photoresist layer
81 opening portion

What is claimed is:

1. A bezel structure of a touch screen, the touch screen being provided with a substrate, and the bezel structure comprising:
    a black matrix portion only provided on a single edge region on a back surface of the substrate;
    a bonding area arranged on the black matrix portion and provided with a plurality of metal leads and a plurality of transparent conductive solder pads, each of the plurality of transparent conductive solder pads being electrically connected with corresponding one metal lead of the plurality of metal leads;
    a first insulating photoresist layer arranged between the plurality of transparent conductive solder pads and the plurality of metal leads in a thickness direction of the substrate, the transparent conductive solder pads being electrically connected with corresponding metal leads via jumper holes provided in the first insulating photoresist layer; and
    a plurality of transparent conductive edge-routing wires arranged on the back surface of the substrate, at both lateral sides thereof adjacent to the end side, each of the plurality of transparent conductive edge-routing wires extending to the bonding area and being constructed at a terminal end thereof as corresponding one of the plurality of transparent conductive solder pads located within the bonding area.

2. The bezel structure according to claim 1,
    wherein the black matrix portion, the transparent conductive solder pads, the first insulating photoresist layer and the metal leads are arranged sequentially in a thickness direction of the substrate therefrom.

3. The bezel structure according to claim 2, further comprising a second insulating photoresist layer, the second insulating photoresist layer being arranged on a side of the metal leads away from the first insulating photoresist layer.

4. The bezel structure according to claim 1,
    wherein the black matrix portion, the metal leads, the first insulating photoresist layer and the transparent conductive solder pads are arranged sequentially in a thickness direction of the substrate therefrom.

5. The bezel structure according to claim 4, further comprising a second insulating photoresist layer, the second insulating photoresist layer being arranged on a side of the transparent conductive solder pads away from the first insulating photoresist layer.

6. The bezel structure according to claim 1, further comprising a plurality of X-direction transparent conducting bars and a plurality of Y-direction transparent conducting bars substantially parallel to the transparent conductive edge-routing wires, both of which are arranged in a central area on the back surface of the substrate, wherein the X-direction transparent conducting bars and the Y-direction transparent conducting bars being electrically isolated from each other.

7. The bezel structure according to claim 6,
    wherein the plurality of X-direction transparent conducting bars are electrically connected with one another via corresponding transparent conductive bridges formed on the substrate, and the transparent conductive bridges are provided with an auxiliary insulating photoresist layers above which the Y-direction transparent conducting bars are arranged.

8. The bezel structure according to claim 7,
    wherein the first insulating photoresist layer and the auxiliary insulating photoresist layer are arranged in a same layer and are formed by a same material.

9. The bezel structure according to claim 1,
    wherein the bezel structure is in a form of an One Glass Solution bezel structure.

10. A touch screen, comprising the bezel structure according to claim 1.

11. A display device, comprising the touch screen according to claim 10.

12. A method for manufacturing a bezel structure of a touch screen, the touch screen being provided with a substrate, and the method comprising steps of:
    forming a black matrix portion only provided on a single edge region on a back surface of the substrate, the black matrix portion being adapted to be formed with a bonding area thereon;
    forming a plurality of transparent conductive edge-routing wires arranged on the back surface of the substrate, at both lateral sides thereof adjacent to the end side, each of the plurality of transparent conductive edge-routing wires extending to the bonding area and being constructed at a terminal end thereof as corresponding one of a plurality of transparent conductive solder pads located within the bonding area;
    forming a first insulating photoresist layer on the back surface of the substrate, the first insulating photoresist layer being formed with jumper holes and each of the jumper holes being positioned at a site where each of the transparent conductive solder pads is located; and
    disposing a plurality of metal leads on the bonding area;
    wherein each of the transparent conductive solder pads is electrically connected with a corresponding metal leads via a jumper hole.

13. The method according to claim 12,
    wherein the steps of forming the black matrix portion, forming the transparent conductive edge-routing wires, forming the first insulating photoresist layer and disposing the metal leads are performed sequentially.

14. The method according to claim 13,
    wherein the step of forming the transparent conductive edge-routing wires further comprises forming a plurality of transparent conductive bridges within a central area on the back surface of the substrate by a same material as that used to form the transparent conductive edge-routing wires; and
    wherein the step of forming the first insulating photoresist layer further comprises forming an auxiliary insulating photoresist layer which covers partially each of the plurality of transparent conductive bridges, by a same material as that used to form the first insulating photoresist layer.

15. The method according to claim 14, further comprising an additional step after the step of forming the first insulating photoresist layer and before the step of disposing the metal leads, the additional step comprising:
    forming a plurality of X-direction transparent conducting bars and a plurality of Y-direction transparent conducting bars within a central area on the back surface of the substrate, the plurality of X-direction transparent conducting bars being electrically connected with one another via corresponding transparent conductive bridges located at joints thereamong, the plurality of Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer.

16. The method according to claim 12,
wherein after the step of disposing the metal leads, a second insulating photoresist layer is formed to cover the back surface of the substrate.

17. The method according to claim 12,
wherein the steps of forming the black matrix portion, disposing the metal leads, forming the first insulating photoresist layer, and forming the transparent conductive edge-routing wires are performed sequentially.

18. The method according to claim 17
wherein the step of disposing metal leads further comprises forming a plurality of transparent conductive bridges within a central area on the back surface of the substrate by a same material as that used to form the metal leads; and
wherein the step of forming the first insulating photoresist layer further comprises forming an auxiliary insulating photoresist layer which covers partially each of the plurality of transparent conductive bridges, by a same material as that used to form the first insulating photoresist layer.

19. The method according to claim 18, wherein the step of forming the transparent conductive edge-routing wires further comprising:
forming a plurality of X-direction transparent conducting bars and a plurality of Y-direction transparent conducting bars within a central area on the back surface of the substrate, wherein the plurality of X-direction transparent conducting bars being electrically connected with one another via corresponding transparent conductive bridges located as joints thereamong, the plurality of Y-direction transparent conducting bars being arranged above the corresponding auxiliary insulating photoresist layer, and the X-direction transparent conducting bars and the Y-direction transparent conducting bars being electrically isolated from each other via the auxiliary insulating photoresist layer.

20. The method according to claim 12,
wherein after the step of forming the transparent conductive edge-routing wires, a second insulating photoresist layer is formed to cover the back surface of the substrate.

* * * * *